(12) United States Patent
Itoh

(10) Patent No.: US 11,829,075 B2
(45) Date of Patent: Nov. 28, 2023

(54) PROCESSING APPARATUS, MANAGEMENT APPARATUS, LITHOGRAPHY APPARATUS, AND ARTICLE MANUFACTURING METHOD

(71) Applicant: CANON KABUSHIKI KAISHA, Tokyo (JP)

(72) Inventor: Satoru Itoh, Shanghai (CN)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/847,220

(22) Filed: Jun. 23, 2022

(65) Prior Publication Data

US 2023/0012400 A1    Jan. 12, 2023

(30) Foreign Application Priority Data

Jul. 8, 2021    (JP) .................................. 2021-113751

(51) Int. Cl.
*G03F 7/20*    (2006.01)
*G03F 7/00*    (2006.01)

(52) U.S. Cl.
CPC ................................ *G03F 7/70533* (2013.01)

(58) Field of Classification Search
CPC .. G03F 7/70533; G03F 7/705; G03F 7/70725; G05B 13/027; G06N 3/04; G06N 3/08
See application file for complete search history.

(56) References Cited

U.S. PATENT DOCUMENTS

| | | | |
|---|---|---|---|
| 2010/0082126 A1* | 4/2010 | Matsushita | G05B 13/027 706/15 |
| 2016/0170311 A1* | 6/2016 | Schmitt-Weaver | G03F 7/70516 355/67 |

FOREIGN PATENT DOCUMENTS

| | | |
|---|---|---|
| JP | H09-108721 A | 4/1997 |
| JP | 2006-128685 A | 5/2006 |

* cited by examiner

*Primary Examiner* — Mesfin T Asfaw
(74) *Attorney, Agent, or Firm* — Carter, DeLuca & Farrell LLP

(57) ABSTRACT

A processing apparatus includes a driver configured to drive a controlled object, and a controller configured to control the driver by generating a command value to the driver based on a control error. The controller includes a first compensator configured to generate a first command value based on the control error, a second compensator configured to generate a second command value based on the control error, and an adder configured to obtain the command value by adding the first command value and the second command value. The second compensator includes a neural network for which a parameter value is decided by learning, and input parameters input to the neural network include at least one of a driving condition of the driver and an environment condition in a periphery of the controlled object in addition to the control error.

9 Claims, 5 Drawing Sheets

PROCESSING APPARATUS, MANAGEMENT APPARATUS, LITHOGRAPHY APPARATUS, AND ARTICLE MANUFACTURING METHOD

BACKGROUND OF THE INVENTION

Field of the Invention

The present invention relates to a processing apparatus, a management apparatus, a lithography apparatus, and an article manufacturing method.

Description of the Related Art

There are provided various techniques for improving the accuracy of control of a controlled object. Japanese Patent Laid-Open No. 2006-128685 describes that in a control system obtained by combining a feedback controller and a feedforward controller, the parameters of the feedforward controller are updated by iterative learning.

In recent years, there is proposed a technique of controlling a controlled object using a neural network and improving the accuracy. The neural network is optimized for each controlled object. The optimized neural network is called a learned network. The controlled object is controlled using the learned neural network.

A control apparatus using a neural network can decide the parameter values of the neural network by performing reinforcement learning. However, since the state of a controlled object can change over time, even the neural network optimized at a given time is no longer optimum since the state of the controlled object has changed thereafter. Therefore, the control accuracy of the control apparatus may deteriorate due to the change in the state of the controlled object.

SUMMARY OF THE INVENTION

The present invention provides a technique advantageous in suppressing deterioration in control accuracy caused by a change in the state of a controlled object.

The present invention in its one aspect provides a processing apparatus comprising a driver configured to drive a controlled object, and a controller configured to control the driver by generating a command value to the driver based on a control error, wherein the controller includes a first compensator configured to generate a first command value based on the control error, a second compensator configured to generate a second command value based on the control error, and an adder configured to obtain the command value by adding the first command value and the second command value, the second compensator includes a neural network for which a parameter value is decided by learning, and input parameters input to the neural network include at least one of a driving condition of the driver and an environment condition in a periphery of the controlled object in addition to the control error.

Further features of the present invention will become apparent from the following description of exemplary embodiments (with reference to the attached drawings).

DESCRIPTION OF THE EMBODIMENTS

Figure 1:
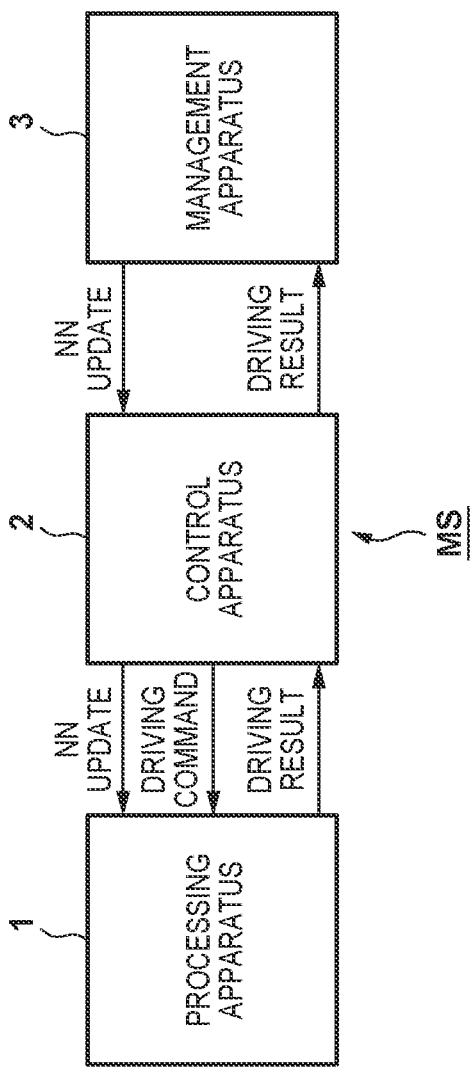
FIG. 1 is a block diagram showing the configuration of a manufacturing system.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 shows the configuration of a manufacturing system MS according to the embodiment. The manufacturing system MS can include, for example, a processing apparatus 1, a control apparatus 2 that controls the processing apparatus 1, and a management apparatus (learning apparatus) 3 that manages the processing apparatus 1 and the control apparatus 2. The processing apparatus 1 is an apparatus that executes processing for a processing target object like a manufacturing apparatus, an inspection apparatus, a monitoring apparatus, or the like. The concept of the processing can include processing, inspection, monitoring, and observation of a processing target object.

The processing apparatus 1 can include a controlled object and control the controlled object using a neural network for which parameter values are decided by reinforcement learning. The control apparatus 2 can be configured to send a driving command to the processing apparatus 1 and receive a driving result or a control result from the processing apparatus 1. The management apparatus 3 can perform reinforcement learning of deciding a plurality of parameter values of the neural network of the processing apparatus 1. More specifically, the management apparatus 3 can decide the plurality of parameter values of the neural network by repeating an operation of sending a driving command to the processing apparatus 1 and receiving a driving result from the processing apparatus 1 while changing all or some of the plurality of parameter values. The management apparatus 3 may be understood as a learning apparatus.

All or some of the functions of the control apparatus 2 may be incorporated in the management apparatus 3. All or some of the functions of the control apparatus 2 may be incorporated in the processing apparatus 1. The processing apparatus 1, the control apparatus 2, and the management apparatus 3 may be formed physically integrally or separately. The processing apparatus 1 may be controlled by the control apparatus 2 as a whole, or may include components controlled by the control apparatus 2 and those not controlled by the control apparatus 2.

Figure 2:
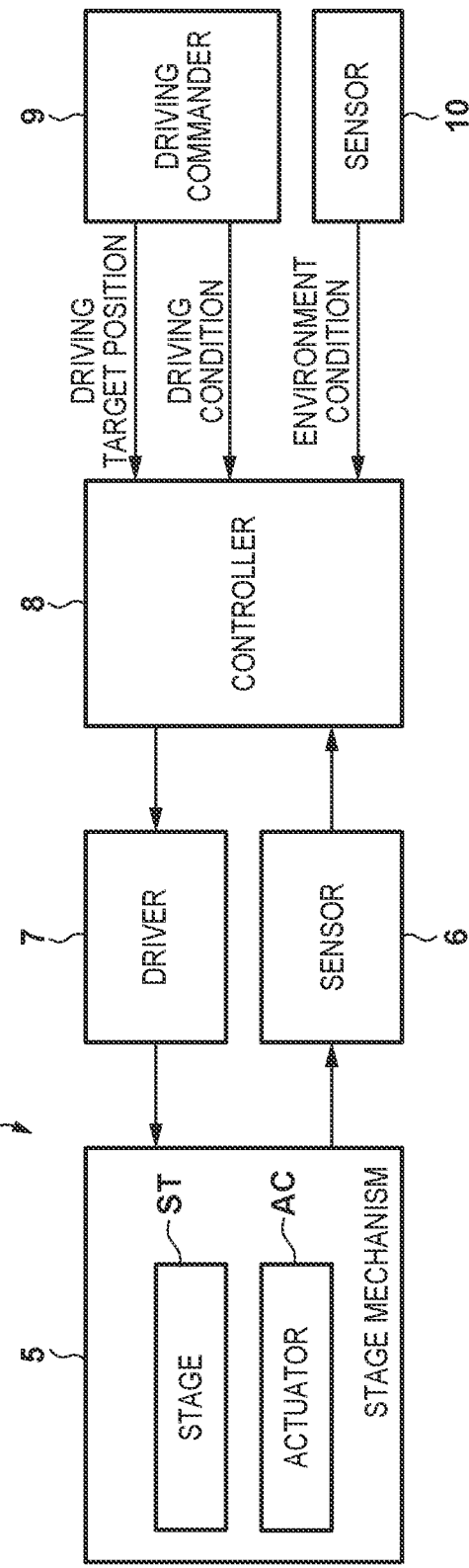
FIG. 2 is a block diagram showing the arrangement of a processing apparatus.

FIG. 2 exemplifies the arrangement of the processing apparatus 1. The processing apparatus 1 can include a stage mechanism 5 including a stage (holder) ST as a controlled object. The processing apparatus 1 can further include a sensor 6 that detects the position or state of the stage ST, a driver 7 that drives the stage mechanism 5, and a controller 8 that receives an output from the sensor 6 and gives a command value to the driver 7. The stage ST can hold a positioning target object. The stage ST can be guided by a guide (not shown). The stage mechanism 5 can include an actuator AC that moves the stage ST. The driver 7 drives the actuator AC. More specifically, for example, the driver 7 can supply, to the actuator AC, a current (electric energy) corresponding to the command value given from the controller 8. The actuator AC can move the stage ST by a force (mechanical energy) corresponding to the current supplied from the driver 7. The controller 8 can control the position or state of the stage ST as the controlled object using the neural network for which the parameter values are decided by reinforcement learning. A driving commander 9 gives the driving target position of the stage ST as the controlled object and the driving condition of the driver 7 to the controller 8. An environment sensor 10 detects the environment condition in the periphery of the stage ST and gives the detected environment condition to the controller 8.

Figure 3:
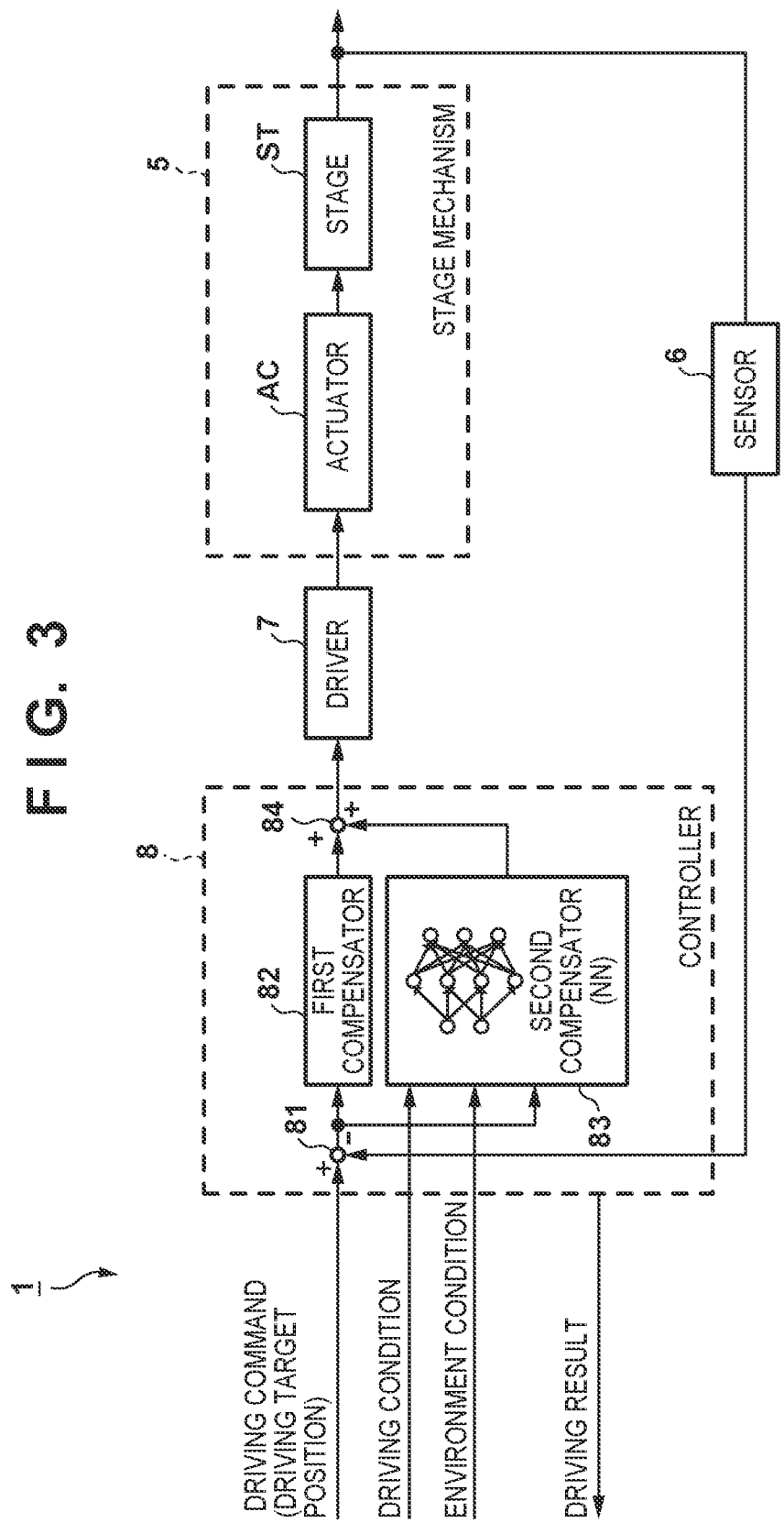
FIG. 3 is a block diagram exemplifying the arrangement of the processing apparatus shown in FIG. 2.

FIG. 3 is a block diagram exemplifying the arrangement of the processing apparatus 1 shown in FIG. 2. The controller 8 can include a subtracter 81, a first compensator 82, a second compensator (neural network) 83, and an adder 84. The subtracter 81 can calculate a control error as a difference between the driving command (for example, the target position) given from the control apparatus 2 and the detection result (for example, the position of the stage ST) output from the sensor 6. The first compensator 82 can generate the first command value by performing compensation calculation for the control error provided from the subtracter 81. The second compensator 83 includes a neural network. The neural network can input, as input parameters, the driving condition input from the driving commander 9 and the environment condition measured by the environment sensor 10 in addition to the control error provided from the subtracter 81, and generate the second command value by performing compensation calculation. The driving condition and the environment condition are pieces of information that are not input to the first compensator 82. The adder 84 can generate the command value by adding the first command value and the second command value. The controller 8, the driver 7, the stage mechanism 5, and the sensor 6 form a feedback control system that controls the stage ST as the controlled object based on the control error.

The first compensator 82 can be, for example, a PID compensator but may be another compensator. When, for example, L represents the number of inputs, M represents the number of intermediate layers, and N represents the number of outputs (L, M, and N are all positive integers), the second compensator 83 can be, for example, a neural network defined by the product of an L×M matrix and an M×N matrix. The plurality of parameter values of the neural network can be decided or updated by reinforcement learning executed by the management apparatus 3. The first compensator 82 is not always necessary, and only the second compensator 83 may generate the command value to be given to the driver 7.

The driving condition input from the driving commander 9 can include, for example, at least one of the current position, target position, driving direction, driving stroke, speed, acceleration, jerk, and snap of the stage but may be another driving condition. Furthermore, the condition may be a value such as a maximum, average, or variance in a series of driving operations. Alternatively, the condition may be the current value, a past history at a specific time, or a future target value after a given time elapses.

The environment condition input from the environment sensor 10 can include, for example, at least one of the pressure, temperature, humidity, vibration, wind speed, and flow rate in the periphery of the stage ST but may be another condition as long as it can be measured by a sensor. The value may be the current value, a past value a given time before, or a future value predicted from the past change. A value obtained by performing filtering processing for the measured value of the sensor may be used.

The management apparatus 3 can function as a learning device or a relearning device that executes a learning sequence when a reward required from the control result of the stage ST by the controller 8 of the processing apparatus 1 does not satisfy a predetermined criterion. In the learning sequence, a parameter value set constituted by the plurality of parameter values of the second compensator (neural network) 83 can be decided or redecided by reinforcement learning.

Figure 4:
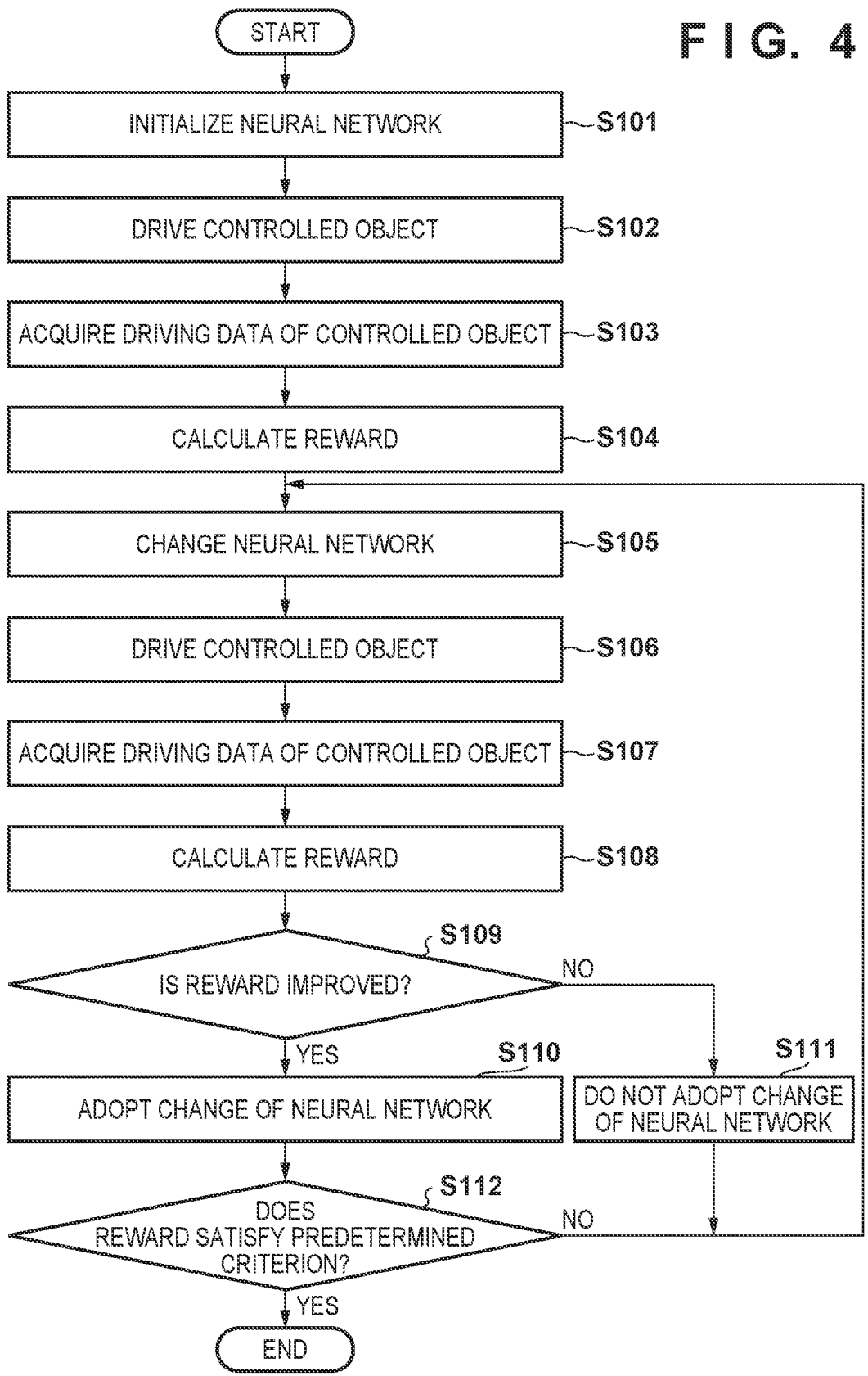
FIG. 4 is a flowchart exemplifying the operation of a management apparatus in a learning sequence.

FIG. 4 exemplifies the operation of the management apparatus 3 in the learning sequence. In step S101, the management apparatus 3 can initialize the plurality parameter values (parameter value set) of the second compensator (neural network) 83. In step S102, the management apparatus 3 can send a command to the processing apparatus 1 to drive the stage ST as the controlled object. More specifically, in step S102, the management apparatus 3 can send a driving command to the controller 8 of the processing apparatus 1 via the control apparatus 2. In response to this, the controller 8 of the processing apparatus 1 can cause the driver 7 to drive the stage ST in accordance with the driving command, thereby controlling the position of the stage ST.

In step S103, the management apparatus 3 can acquire, from the controller 8 of the processing apparatus 1 via the control apparatus 2, driving data indicating the driving state of the stage ST as the controlled object in step S102. The driving data can include, for example, at least one of the output from the sensor 6 and the output from the subtracter 81. In step S104, the management apparatus 3 can calculate a reward based on the driving data acquired in step S103. The reward can be calculated based on a predefined formula. For example, if the reward is calculated based on the control error, the reward can be calculated in accordance with a formula that gives the reciprocal of the control error, a formula that gives the reciprocal of the logarithm of the control error, a formula that gives the reciprocal of the quadratic function of the control error, or the like, but may be calculated in accordance with another formula. In one example, as the value of the reward is larger, the second compensator (neural network) 83 is more superior. Conversely, as the value of the reward is smaller, the second compensator (neural network) 83 may be more superior.

In step S105, the management apparatus 3 generates a new parameter value set by changing at least one of the plurality of parameter values of the second compensator (neural network) 83, and sets the new parameter values in the second compensator (neural network) 83. Steps S106, S107, and S108 can be the same as steps S102, S103, and S104, respectively. In step S106, the management apparatus 3 can send a command to the processing apparatus 1 to drive the stage ST. More specifically, in step S106, the management apparatus 3 can send a driving command to the controller 8 of the processing apparatus 1 via the control apparatus 2. In response to this, the controller 8 of the processing apparatus 1 can cause the driver 7 to drive the stage ST in accordance with the driving command, thereby controlling the position of the stage ST. In step S107, the management apparatus 3 can acquire, from the controller 8 of the processing apparatus 1 via the control apparatus 2, driving data indicating the driving state of the stage ST in step S106. In step S108, the management apparatus 3 can calculate a reward based on the driving data acquired in step S107.

In step S109, the management apparatus 3 determines whether the reward calculated in step S108 is improved, as compared with the reward calculated in step S104. Then, if the reward calculated in step S108 is improved, as compared with the reward calculated in step S104, the management apparatus 3 adopts, in step S110, as the latest parameter values, the parameter value set obtained after the change operation is executed in step S105. On the other hand, if the reward calculated in step S108 is not improved, as compared with the reward calculated in step S104, the management apparatus 3 does not adopt, in step S111, the parameter value set obtained after the change operation is executed in step S105, and returns to step S105. In this case, in step S105, a new parameter value set is set in the second compensator (neural network) 83.

If step S110 is executed, the management apparatus 3 determines in step S112 whether the reward calculated in step S108 immediately precedingly executed satisfies the predetermined criterion. If the reward satisfies the predetermined criterion, the processing shown in FIG. 4 ends. This means that the parameter value set generated in step S105 immediately precedingly executed is decided as the parameter value set after reinforcement learning. The neural network set with the parameter value set after reinforcement learning can be called a learned model. On the other hand, if it is determined in step S112 that the reward calculated in step S108 immediately precedingly executed does not satisfy the predetermined criterion, the management apparatus 3 repeats the processes from step S105.

The driving condition and the environment condition when executing step S102 are not constant, and some or all of the possible conditions can be changed. That is, the management apparatus 3 (learning device) repeats reinforcement learning while changing at least one of the driving condition and the environment condition. Furthermore, in the learning step, learning is repeatedly executed while changing a combination pattern among a first number of first combination patterns of the driving condition and the environment condition. If the reward exceeds a predetermined value while learning is repeatedly executed, the combination patterns of the driving condition and the environment condition may be increased. That is, in this case, learning may be repeatedly executed while changing a combination pattern among a second number of second combination patterns, which is larger than the first number.

The present inventor found that even if the history of the control error is the same, the future behavior of the controlled object may change due to a difference in the driving condition of the controlled object or the environment condition in the periphery. In this embodiment, to cope with such case, the input parameters input to the neural network can include at least one of the driving condition and the environment condition in addition to the control error. Thus, the neural network is learned to output the command value to the driver 7 that can suppress the control error.

The processing apparatus 1 can operate, in a sequence (to be referred to as an actual sequence hereinafter) of executing processing for the processing target object, as an apparatus including the learned model (second compensator 83) obtained in the above-described learning sequence. In one example, the processing apparatus 1 can execute the actual sequence under management of the management apparatus 3. However, in another example, the processing apparatus 1 can execute the actual sequence independently of management of the management apparatus 3.

Second Embodiment

Figure 5:
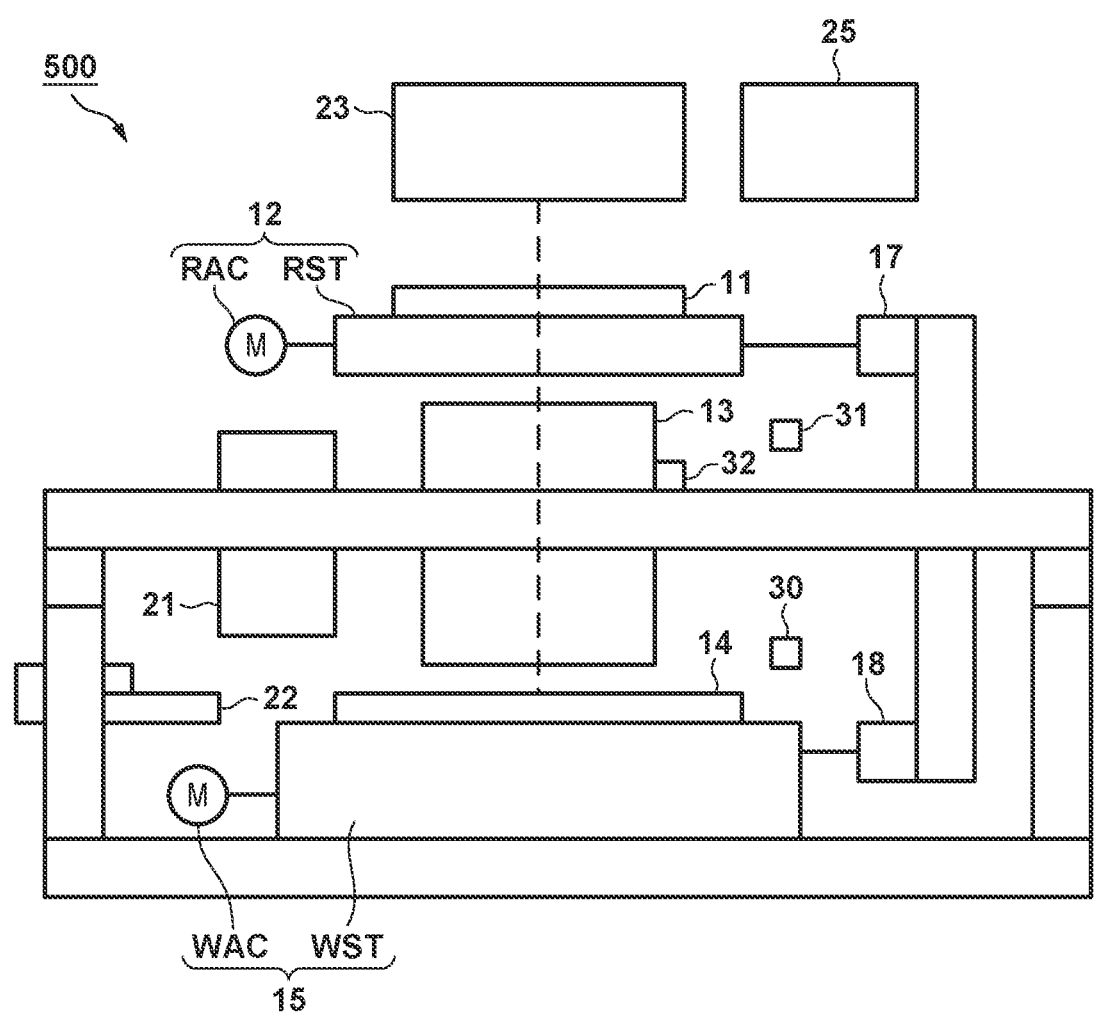
FIG. 5 is a view exemplifying the arrangement of a scanning exposure apparatus.

An example in which the above-described manufacturing system MS is applied to a scanning exposure apparatus 500 shown in FIG. 5 will be described below with reference to FIG. 6. The scanning exposure apparatus 500 is a step-and-scan exposure apparatus that performs scanning exposure of a substrate 14 by slit light shaped by a slit member. The scanning exposure apparatus 50) can include an illumination optical system 23, an original stage mechanism 12, a projection optical system 13, a substrate stage mechanism 15, a first position measurement device 17, a second position measurement device 18, a substrate mark measurement device 21, a substrate conveyer 22, and a controller 25.

The controller 25 controls the illumination optical system 23, the original stage mechanism 12, the projection optical system 13, the substrate stage mechanism 15, the first position measurement device 17, the second position measurement device 18, the substrate mark measurement device 21, and the substrate conveyer 22. The controller 25 controls processing of transferring a pattern of an original 11 to the substrate 14. Furthermore, the controller 25 can include the function of the controller 8 according to the first embodiment. The controller 25 can be formed by, for example, a Programmable Logic Device (PLD) such as a Field Programmable Gate Array (FPGA), an Application Specific Integrated Circuit (ASIC), a general-purpose computer installed with a program, or a combination of all or some of these components.

The original stage mechanism 12 can include an original stage RST that holds the original 11, and a first actuator RAC that drives the original stage RST. The substrate stage mechanism 15 can include a substrate stage WST that holds the substrate 14, and a second actuator WAC that drives the substrate stage WST. The illumination optical system 23 illuminates the original 11. The illumination optical system 23 shapes, by a light shielding member such as a masking blade, light emitted from a light source (not shown) into, for example, band-like or arcuate slit light long in the X direction, and illuminates a portion of the original 11 with this slit light. The original 11 and the substrate 14 are held by the original stage RST and the substrate stage WST, respectively, and arranged at almost optically conjugate positions (on the object plane and image plane of the projection optical system 13) via the projection optical system 13.

The projection optical system 13 has a predetermined projection magnification (for example, 1, ½, or ¼), and projects the pattern of the original 11 on the substrate 14 by the slit light. A region (a region irradiated with the slit light) on the substrate 14 where the pattern of the original 11 is projected can be called an irradiation region. The original stage RST and the substrate stage WST are configured to be movable in a direction (Y direction) orthogonal to the optical axis direction (Z direction) of the projection optical system 13. The original stage RST and the substrate stage WST are relatively scanned at a velocity ratio corresponding to the projection magnification of the projection optical system 13 in synchronism with each other. This scans the substrate 14 in the Y direction with respect to the irradiation region, thereby transferring the pattern formed on the original 11 to a shot region of the substrate 14. Then, by sequentially performing such scanning exposure for the plurality of shot regions of the substrate 14 while moving the substrate stage WST, the exposure processing for the one substrate 14 is completed.

The first position measurement device 17 includes, for example, a laser interferometer, and measures the position of the original stage RST. For example, the laser interferometer irradiates, with a laser beam, a reflecting plate (not shown) provided in the original stage RST, and detects a displacement (a displacement from a reference position) of the original stage RST by interference between the laser beam reflected by the reflecting plate and the laser beam reflected by a reference surface. The first position measurement device 17 can acquire the current position of the original stage RST based on the displacement. In this example, the first position measurement device 17 may measure the position of the original stage RST by a position measurement device, for example, an encoder instead of the laser interferometer. The substrate mark measurement device 21 includes, for example, an optical system and an image sensor, and can detect the position of a mark provided on the substrate 14.

The second position measurement device 18 includes, for example, a laser interferometer, and measures the position of the substrate stage WST. For example, the laser interferometer irradiates, with a laser beam, a reflecting plate (not shown) provided in the substrate stage WST, and detects a displacement (a displacement from a reference position) of the substrate stage WST by interference between the laser beam reflected by the reflecting plate and the laser beam reflected by a reference surface. The second position measurement device 18 can acquire the current position of the substrate stage WST based on the displacement. In this example, the second position measurement device 18 may measure the position of the substrate stage WST by a position measurement device, for example, an encoder instead of the laser interferometer.

Sensors 30, 31, and 32 are arranged near a controlled object, and can detect a pressure, temperature, humidity, vibration, wind speed, flow rate, and the like as the environment condition in the periphery of the controlled object. In the example shown in FIG. 5, the sensor 30 is arranged near the substrate stage WST, the sensor 31 is arranged near the original stage RST, and the sensor 32 is arranged near the projection optical system 13.

The scanning exposure apparatus 500 is required to accurately transfer the pattern of the original 11 to the target position of the substrate 14. To achieve this, it is important to accurately control the relative position of the original 11 on the original stage RST with respect to the substrate 14 on the substrate stage WST during scanning exposure. Therefore, as a reward, a value for evaluating the relative position error (synchronous error) between the original stage RST and the substrate stage WST can be adopted. To improve the detection accuracy of the mark of the substrate 14, it is important to accurately position the substrate stage WST under the substrate mark measurement device 21. Therefore, as a reward, a value for evaluating the control error of the substrate stage WST while the mark is imaged can be adopted. To improve the throughput, it is important to increase the conveyance speed of the substrate. Furthermore, at the time of loading and unloading the substrate, it is important that the control errors of the substrate conveyer 22 and the substrate stage WST converge to a predetermined value or less in a short time after the completion of driving. Therefore, as a reward, a value for evaluating the convergence times of the substrate conveyer 22 and the substrate stage WST can be adopted. Each of the substrate stage mechanism 15, the original stage mechanism 12, and the substrate conveyer 22 is an example of an operation unit that performs an operation for the processing of transferring the pattern of the original 11 to the substrate 14.

Figure 6:
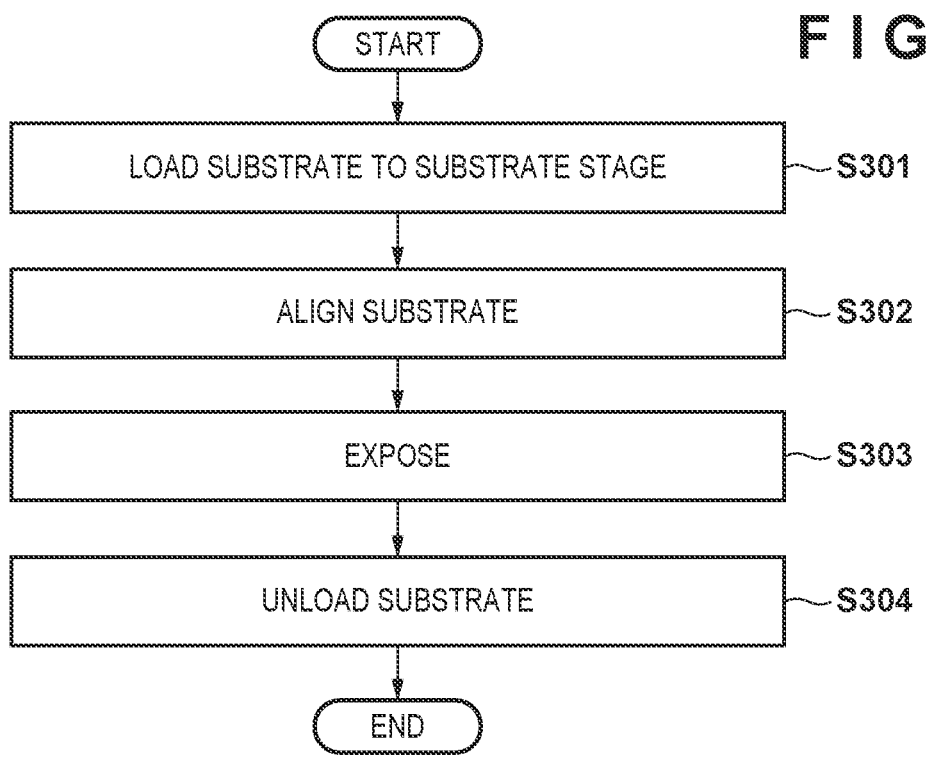
FIG. 6 is a flowchart exemplifying the operation of the scanning exposure apparatus in an actual sequence.

FIG. 6 exemplifies the actual sequence of the scanning exposure apparatus 500. This actual sequence starts when the management apparatus 3 instructs the controller 25 of the scanning exposure apparatus 500 to execute the actual sequence (substrate processing sequence). The substrate processing sequence can include, for example, steps S301, S302, and S303 as a plurality of sub-sequences.

In step S301, the controller 25 controls the substrate conveyer 22 to load (convey) the substrate 14 to the substrate stage WST. In step S302, the controller 25 can control the substrate stage mechanism 15 so that the mark of the substrate 14 falls within the field of view of the substrate mark measurement device 21, and control the substrate mark measurement device 21 to detect the position of the mark of the substrate 14. This operation can be executed for each of the plurality of marks of the substrate 14. In step S303, the controller 25 controls the substrate stage mechanism 15, the original stage mechanism 12, the illumination optical system 23, and the like so that the pattern of the original 11 is transferred to each of the plurality of shot regions of the substrate 14 (exposure step). In step S304, the controller 25 controls the substrate conveyer 22 to unload (convey) the substrate 14 on the substrate stage WST.

In step S301, in order for the substrate conveyer 22 to accurately place the substrate 14 on the substrate stage WST, the positioning accuracy of the substrate conveyer 22 is required. In this case, as the driving condition input to the second compensator 83, the speed, acceleration, and jerk of the substrate conveyer 22 can be obtained. As the environment condition, a pressure when the substrate conveyer 22 sucks the substrate 14, or an output from an acceleration sensor provided on the substrate conveyer 22 when the substrate conveyer 22 is driven can be obtained.

In step S302, it is required that the error of the substrate stage WST converges as quickly as possible by driving the substrate stage WST so that the mark on the substrate 14 is located immediately under the substrate mark measurement device 21. In this case, the driving condition input to the second compensator 83 can be, for example, at least one of the speed, acceleration, and jerk of the substrate stage WST. Alternatively, the driving condition may be at least one of the direction and the distance when, in the state in which a given mark is located immediately under the substrate mark measurement device 21, the substrate stage WST is driven so that the mark to be measured next is located immediately under the substrate mark measurement device 21. Furthermore, the environment condition can be at least one of a change in pressure in a space measured by a pressure sensor when the substrate stage WST is driven, and an output from an acceleration sensor provided near the substrate mark measurement device.

In step S303, the driving condition input to the second compensator 83 can be at least one of the following pieces of information.

Coordinates for specifying a shot region as an exposure target on the substrate

The size of a shot region in the X direction and/or the Y direction

The speed, acceleration, jerk, and/or driving direction when moving the substrate stage or the original stage at the time of exposure The environment condition input to the second compensator 83 can be at least one of the strength of exposure light with which the substrate is irradiated, and the pressure, temperature, humidity, vibration, wind speed, and flow rate detected by the sensors 30, 31, and 32.

Examples of the controlled object for which a neural network is formed are the substrate stage mechanism 15, the original stage mechanism 12, and the substrate conveyer 22 but a neural network may be incorporated in another component. For example, a plurality of components such as the substrate stage mechanism 15, the original stage mechanism 12, and the substrate conveyer 22 may be controlled by one neural network or the plurality of components may be controlled by different neural networks, respectively. Furthermore, as a learned model, the same learned model or different learned models may be used for the conveyance sequence, the measurement sequence, and the exposure sequence. In calculation of a reward, the same formula or different formulas may be used for the conveyance sequence, the measurement sequence, and the exposure sequence.

Figure 7A:
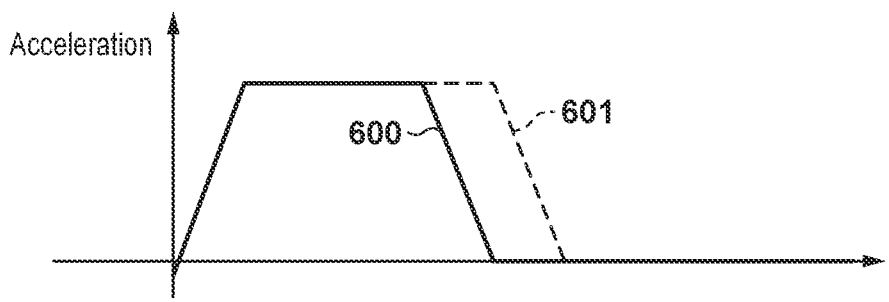
FIGS. 7A and 7B are graphs showing the reduction effect of a control error of a controlled object according to an embodiment.
Figure 7B:
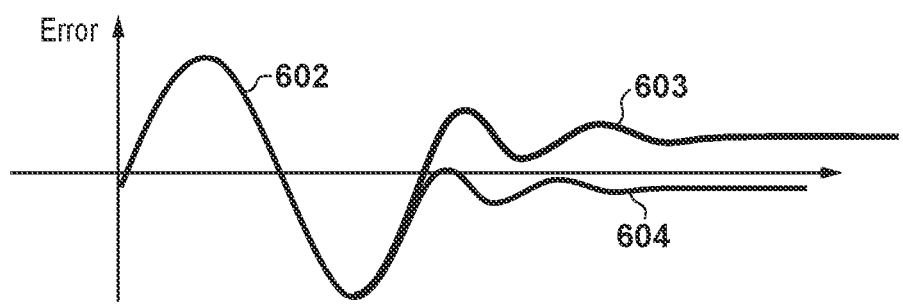

FIGS. 7A and 7B are graphs showing the reduction effect of the control error of the controlled object when this embodiment is applied. FIG. 7A shows time profiles of the acceleration as one driving condition. When comparing a graph 600 indicated by a solid line and a graph 601 indicated by a broken line with each other, a change in acceleration is the same up to a midpoint but the timing of returning the acceleration to 0 is different. Referring to FIG. 7B, a graph 603 represents the control error when the controlled object is driven with the acceleration profile of the graph 600, and a graph 604 represents the control error when the controlled object is driven with the acceleration profile of the graph 601. In a section 602 where the acceleration condition is the same, the graphs 603 and 604 indicate the identical error waveforms but error transitions become different from each other in the middle. Even if the error history is the same but a difference is generated in the error due to a difference in the future acceleration condition, it is possible to provide a neural network capable of suppressing the error by inputting the acceleration condition to the neural network.

The example in which the manufacturing system MS is applied to the scanning exposure apparatus 500 has been explained above. However, the manufacturing system MS may be applied to an exposure apparatus (for example, a stepper) of another type or a lithography apparatus of another type such as an imprint apparatus. In this case, the lithography apparatus is an apparatus for forming a pattern on a substrate, and the concept includes an exposure apparatus, an imprint apparatus, and an electron beam drawing apparatus.

An article manufacturing method of manufacturing an article (for example, a semiconductor IC element, a liquid crystal display element, or a MEMS) using the above-described lithography apparatus will be described below. The article manufacturing method can be a method that includes a transfer step of transferring a pattern of an original to a substrate using the lithography apparatus, and a processing step of processing the substrate having undergone the transfer step, thereby obtaining an article from the substrate having undergone the processing step.

When the lithography apparatus is an exposure apparatus, the article manufacturing method can include a step of exposing a substrate (a substrate, a glass substrate, or the like) coated with a photosensitive agent, a step of developing the substrate (photosensitive agent), and a step of processing the developed substrate in other known steps. The other known steps include etching, resist removal, dicing, bonding, and packaging. According to this article manufacturing method, a higher-quality article than a conventional one can be manufactured. When the lithography apparatus is an imprint apparatus, the article manufacturing method can include a step of forming a pattern made of a cured product of an imprint material by molding the imprint material on a substrate using a mold, and a step of processing the substrate using the pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-113751, filed Jul. 8, 2021, which is hereby incorporated by reference herein in its entirety.

What is claimed is:

1. A processing apparatus comprising:
   a driver configured to drive a controlled object; and
   a controller configured to control the driver by generating a command value to the driver based on a control error,
   wherein the controller includes:
   a first compensator configured to generate a first command value based on the control error,
   a second compensator configured to generate a second command value based on the control error, and
   an adder configured to obtain the command value by adding the first command value and the second command value,
   the second compensator includes a neural network for which a parameter value is decided by learning, and
   input parameters input to the neural network include a driving condition of the driver and an environment condition in a periphery of the controlled object in addition to the control error.

2. The apparatus according to claim 1, wherein the driving condition and the environment condition as the input parameters are pieces of information that are not input to the first compensator.

3. The apparatus according to claim 1, wherein the driving condition includes at least one of a position, a driving direction, a driving stroke, a speed, an acceleration, a jerk, and a snap of the controlled object.

4. The apparatus according to claim 1, wherein the environment condition includes at least one of a pressure, a temperature, and a vibration in the periphery of the controlled object.

5. A management apparatus for managing a processing apparatus defined in claim 1, the management apparatus comprising:
   a learning device configured to redecide the parameter value by learning based on a control result of the controlled object by the controller,
   wherein the learning device repeats the learning while changing at least one of the driving condition and the environment condition.

6. The apparatus according to claim 5, wherein in a case that a reward required from the control result of the controlled object by the controller does not satisfy a criterion, the learning device repeats the learning while changing at least one of the driving condition and the environment condition.

7. The apparatus according to claim 6, wherein
in a case that the reward required from the control result of the controlled object by the controller does not satisfy the criterion, the learning device repeats the learning while changing a combination pattern among a first number of first combination patterns of the driving condition and the environment condition, and
in a case that the reward exceeds a predetermined value while the learning is repeated, the learning device repeats the learning while changing a combination pattern among a second number of second combination patterns, which is larger than the first number.

8. A lithography apparatus for performing processing of transferring a pattern of an original to a substrate, comprising:
  a driver configured to drive a controlled object for the processing; and
  a controller configured to control the driver by generating a command value to the driver based on a control error, wherein the controller includes:
    a first compensator configured to generate a first command value based on the control error,
    a second compensator configured to generate a second command value based on the control error, and
    an adder configured to obtain the command value by adding the first command value and the second command value,
  the second compensator includes a neural network for which a parameter value is decided by learning, and is configured to control the driver using the neural network, and
  input parameters input to the neural network include a driving condition of the driver and an environment condition in a periphery of the controlled object in addition to the control error.

9. An article manufacturing method comprising:
  transferring a pattern of an original to a substrate using a lithography apparatus defined in claim 8; and
  processing the substrate having undergone the transferring,
  wherein an article is obtained from the substrate having undergone the processing.

\* \* \* \* \*